(12) United States Patent
Chen et al.

(10) Patent No.: US 8,251,321 B2
(45) Date of Patent: Aug. 28, 2012

(54) CABLE MANAGEMENT ARM CONNECTION SYSTEM

(75) Inventors: Ken-Ching Chen, Kaohsiung Hsien (TW); Shih-Long Huang, Kaohsiung Hsien (TW); Shun-Ho Yang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 1392 days.

(21) Appl. No.: 11/776,005

(22) Filed: Jul. 11, 2007

(65) Prior Publication Data

US 2009/0014601 A1      Jan. 15, 2009

(51) Int. Cl.
*F16L 3/08* (2006.01)

(52) U.S. Cl. ... 248/70; 248/68.1; 248/298.1; 312/334.5; 312/273

(58) Field of Classification Search ............ 248/56, 248/70, 68.1, 27.1, 200.1, 221.11, 298.1; 361/825, 826, 727; 312/334.4, 334.5, 273
See application file for complete search history.

(56) References Cited

U.S. PATENT DOCUMENTS

| | | | |
|---|---|---|---|
| 6,305,556 B1* | 10/2001 | Mayer | 211/26 |
| 6,600,665 B2* | 7/2003 | Lauchner | 361/826 |
| 6,902,069 B2* | 6/2005 | Hartman et al. | 211/26 |
| 7,472,795 B2* | 1/2009 | Dubon et al. | 211/26 |
| 7,554,819 B2* | 6/2009 | Chen et al. | 361/826 |
| 7,654,398 B2* | 2/2010 | Bridges et al. | 211/26 |
| 7,712,615 B2* | 5/2010 | Chen et al. | 211/26 |
| 7,746,667 B1* | 6/2010 | Baiza et al. | 361/825 |
| 2004/0079711 A1* | 4/2004 | Hartman et al. | 211/26 |
| 2005/0145582 A1* | 7/2005 | Dubon et al. | 211/26 |
| 2006/0081735 A1 | 4/2006 | Chen et al. | |
| 2006/0081736 A1 | 4/2006 | Chen et al. | |
| 2006/0113433 A1 | 6/2006 | Chen et al. | |
| 2007/0017883 A1* | 1/2007 | Bridges et al. | 211/26 |
| 2007/0227756 A1* | 10/2007 | Doerr et al. | 174/69 |
| 2009/0078834 A1* | 3/2009 | Chen et al. | 248/70 |
| 2010/0193646 A1* | 8/2010 | Chen et al. | 248/70 |

* cited by examiner

*Primary Examiner* — Terrell McKinnon
*Assistant Examiner* — Eret McNichols
(74) *Attorney, Agent, or Firm* — Rosenberg, Klein & Lee

(57) ABSTRACT

A cable management arm connection system includes a main body, a support frame, a support block, a support locking member, and two mounting members. The main body is provided with a sleeve to slide along the support frame. Both ends of the main body are connected to the mounting members, respectively. Both ends of the support frame are connected to the support block and the support locking member, respectively. An engaging button is provided on each of the mounting members and the support locking member. Both the support block and the support locking member are respectively connected for sliding and secured in place corresponding to left or right side of the slide assembly for the main body to extend and slide on the support frame as the slide assembly stretches.

7 Claims, 12 Drawing Sheets

CABLE MANAGEMENT ARM CONNECTION SYSTEM

BACKGROUND OF THE INVENTION (a) Field of the Invention

The present invention relates to a cable management arm connection system, and more particularly, to one that is provided with a support frame and allowing selection of mounting members of the cable management arm on the left or the right side to a slide assembly as desired in both directions.

(b) Description of the Prior Art

Those electronic products (e.g., servers) overlapped in a storage space available on top of a drawer slide have usually provided on each of both sides of those electronic products a slide for them to slide along on tracks in relation to those slides; and those electronic products are received in a cable management arm with their cables contained therein.

The cable management arm is usually adapted with slides with one end and another end of the cable management arm as supports; a folding member (usually related to a hinge) is disposed at where between both ends of the cable management arm. When folded up, the folding member shall be suspended and clear away from either support. However, weight of both cables and the cable management arm at where the folding member is located will gradually droop to affect operation within the storage space heavily loaded with the electronic products.

In the recent development of the prior art, e.g., US Early Publication No. 2006/0081735 A1, 2006/0081736 A1, and 2006/0113433 A1 are related to a design adapted with a slide assembly to prevent a folding member of a cable management arm from drooping by sharing certain weight of the cable management arm.

SUMMARY OF THE INVENTION

The primary purpose of the present invention is to provide a cable management arm connection system to correct the problem of a cable management arm of the prior art that is vulnerable to drooping when suspended and to allow easier installation in selecting direction for mounting a sliding assembly.

According to the present invention, there is provided a cable management arm connection system comprising a main body, a support frame, a support block, a support locking member, and two mounting members; the main body comprising a front arm, a rear arm, a middle arm, and a sleeve; the sleeve being connected to the middle arm and inserted to the support frame; the support frame having two ends connected to the support block and the support locking member; the two mounting members being respectively connected to two ends of the main body; the sleeve being pivotally connected to the middle arm; an arc slot and a retainer being respectively disposed on the middle arm and the sleeve; and the sleeve turning within a certain range of angle in relation to the middle arm.

Preferably, each of the two mounting members is connected to a transition plate; one mounting member is connected to the front arm by means of the transition plate; and the other mounting member is connected to the rear arm by means of another transition plate.

Preferably, the support frame comprises an outer rod and an inner rod; the inner rod is connected into the outer rod; the support block is provided with a pivoting plate; one end of the outer rod of the support frame is connected to the support locking member; one end of the inner rod is connected to the pivoting plate of the support block; and the outer rod is inserted through the sleeve.

Preferably, two press portions are disposed on the support block; and each of the press portions is resiliently bent.

Preferably, a protruding bit is disposed on the back of the support block.

Preferably, the cable management arm connection system further comprises a slide assembly; wherein the slide assembly includes an inner track, a middle track, and an outer track; rear ends of the inner track and the outer track are provided with a wedging base, respectively; folded edges and retaining bits are provided on the top and bottom of the wedging base; a retaining piece being disposed at the center of the wedging base; a locating member is disposed on a rear end of the middle track; the locating member is disposed with a through hole; and each of the mounting members and the support locking member is provided with an engaging button corresponding to the wedging base and the locating member.

Preferably, the engaging button comprises a cylinder, a bolt, a pull, and an elastic element; the elastic element is received in the cylinder; the bolt penetrates through the cylinder and the elastic member; the bolt and the pull are connected to each other; the elastic element holds against the cylinder and the bolt; and the pull and the bolt are subject to the elastic element to maintain the bolt being exposed to hold against the wedging base and the locating member.

Preferably, the rear end of the outer track is provided with a resilient retainer; and the resilient retainer is provided with a pair of retaining feet with each foot having a retaining surface.

Compared to the prior art, the present invention provides the following effects and advantages:

a. Mounting members at both ends of the main body respectively corresponding to the wedging bases at the ends of the inner track and the outer track are interchangeable to permit the selection of having the support for the main body linked to the slide assembly to be on the right or the left side of the slide assembly.

b. The support frame of the main body is inserted to the middle arm with the turning sleeve for the main body to provide whole-course support effects; and the turning angle of the sleeve is allowed a smooth and well-facilitated folding in or stretching out for the main body.

DETAILED DESCRIPTION OF THE PREFERRED EMBODIMENTS

Figure 1:
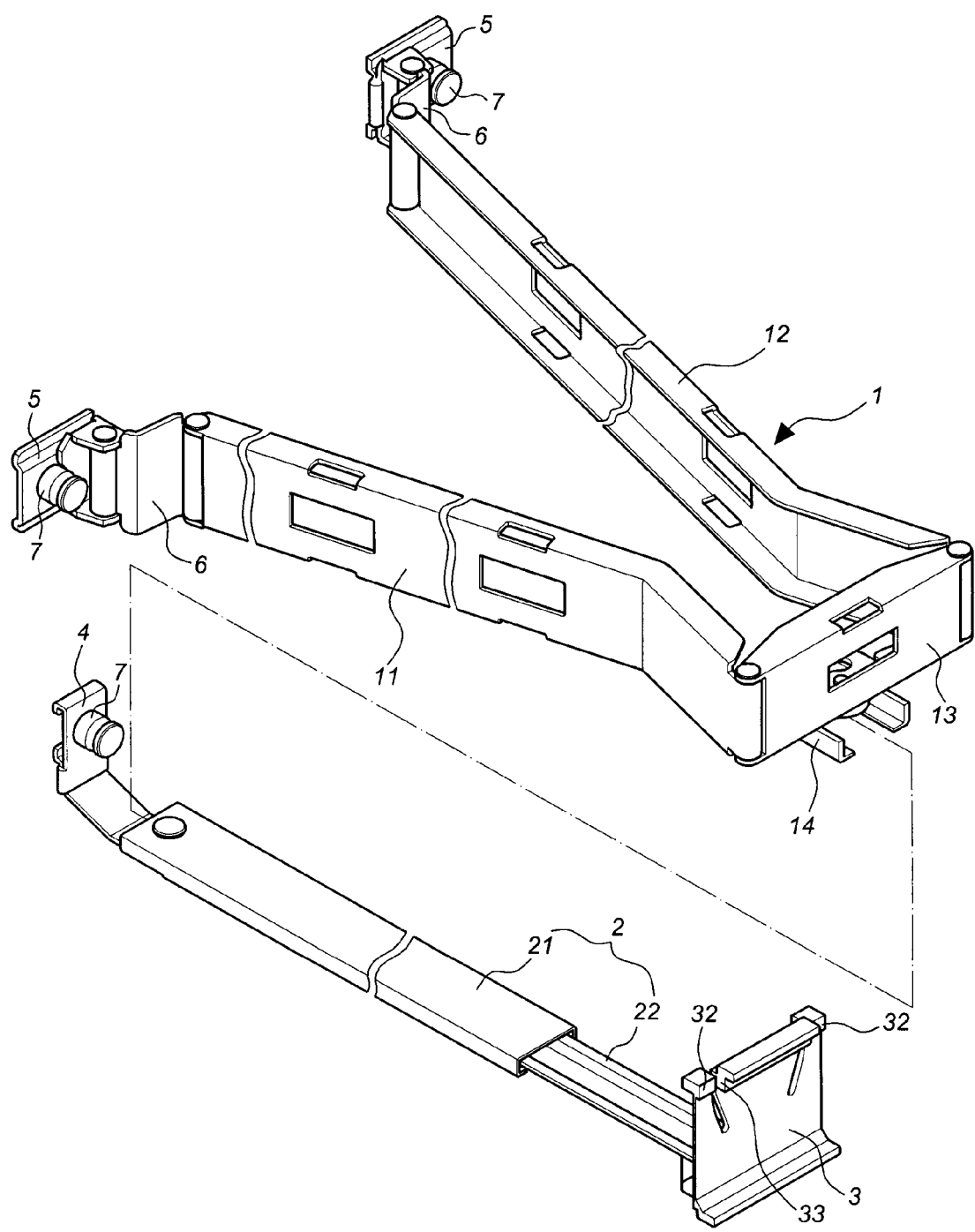
FIG. 1 is an exploded view of a preferred embodiment of the present invention.
Figure 2:
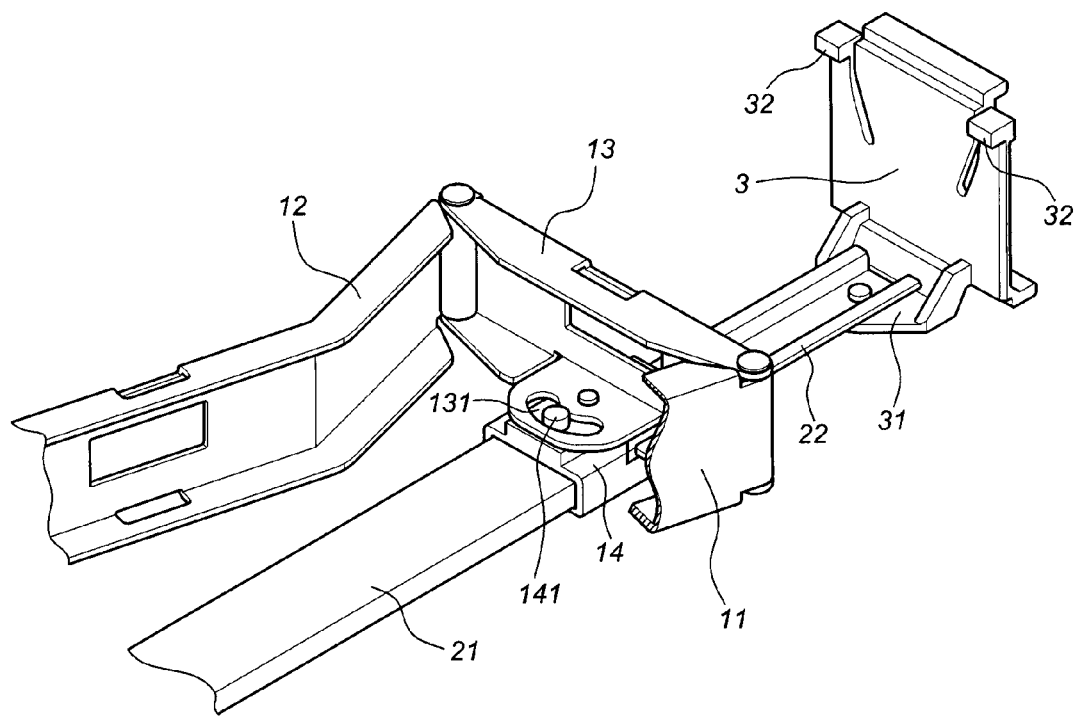
FIG. 2 is a schematic view showing a local construction of the preferred embodiment of the present invention.

Referring to FIGS. 1 and 2, a cable management arm of a preferred embodiment of the present invention comprises a main body (1), a support frame (2), a support block (3), a support locking member (4), two mounting members (5), two transition plates (6), and a plurality of engaging buttons (7).

The main body (1) includes a front arm (11), a rear arm (12), a middle arm (13), and a sleeve (14). The middle arm (13) is disposed between the front arm (11) and the rear arm (12). The sleeve (14) is pivotally connected to the middle arm (13). An arc slot (131) and a retainer (141) are respectively disposed on the middle arm (13) and the sleeve (14) to allow the sleeve (14) rotating within a specific range of angle in relation to the middle arm (13).

The support frame (2) comprises an outer rod (21) and an inner rod (22). The inner rod (22) is inserted into the outer rod (21) and the outer rod (21) is inserted through the sleeve (14) of the main body (1).

The support block (3) comprises a pivoting plate (31) at a lower end thereof and a pair of press portion (32) at respective sides thereof. Each press portion (32) can be resiliently bent. A protruding bit (33) is provided on the back of the support block (3) between the two press portions (32). The support block (3) is connected to the inner rod (22) of the support frame (2) by means of the pivoting plate (31).

The support locking member (4) is provided with an engaging button (7) and is connected to the outer rod (21) of the support frame (2).

Each of the mounting members (5) is provided with an engaging button (7). The mounting members (5) are connected to the transition plates (6), where are further connected to the front arm (11) and the rear arm (12) of the main body (1) for the two mounting members (5) to be respectively located at both ends of the main body (1).

Figure 3:
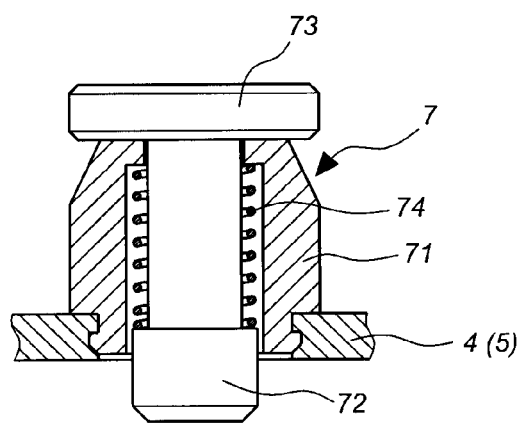
FIG. 3 is a schematic view showing a construction of an engaging button of the preferred embodiment of the present invention.

As illustrated in FIG. 3, the engaging button (7) comprises a cylinder (71), a bolt (72), a pull (73), and an elastic element (74). The elastic element (74) is received in the cylinder (71) with the bolt (72) penetrating into the cylinder (71) and the elastic element (74). The bolt (72) and the pull (73) are connected to each other. The elastic element (74) holds against the cylinder (71) and the bolt (72) so that both the pull (73) and the bolt (72) for being subject to force applied by the elastic element (74) maintain the bolt (72) always being exposed in normal status. The engaging button (7) has the cylinder (71) riveted to the mounting member (5) or the support locking member (4).

Figure 4:
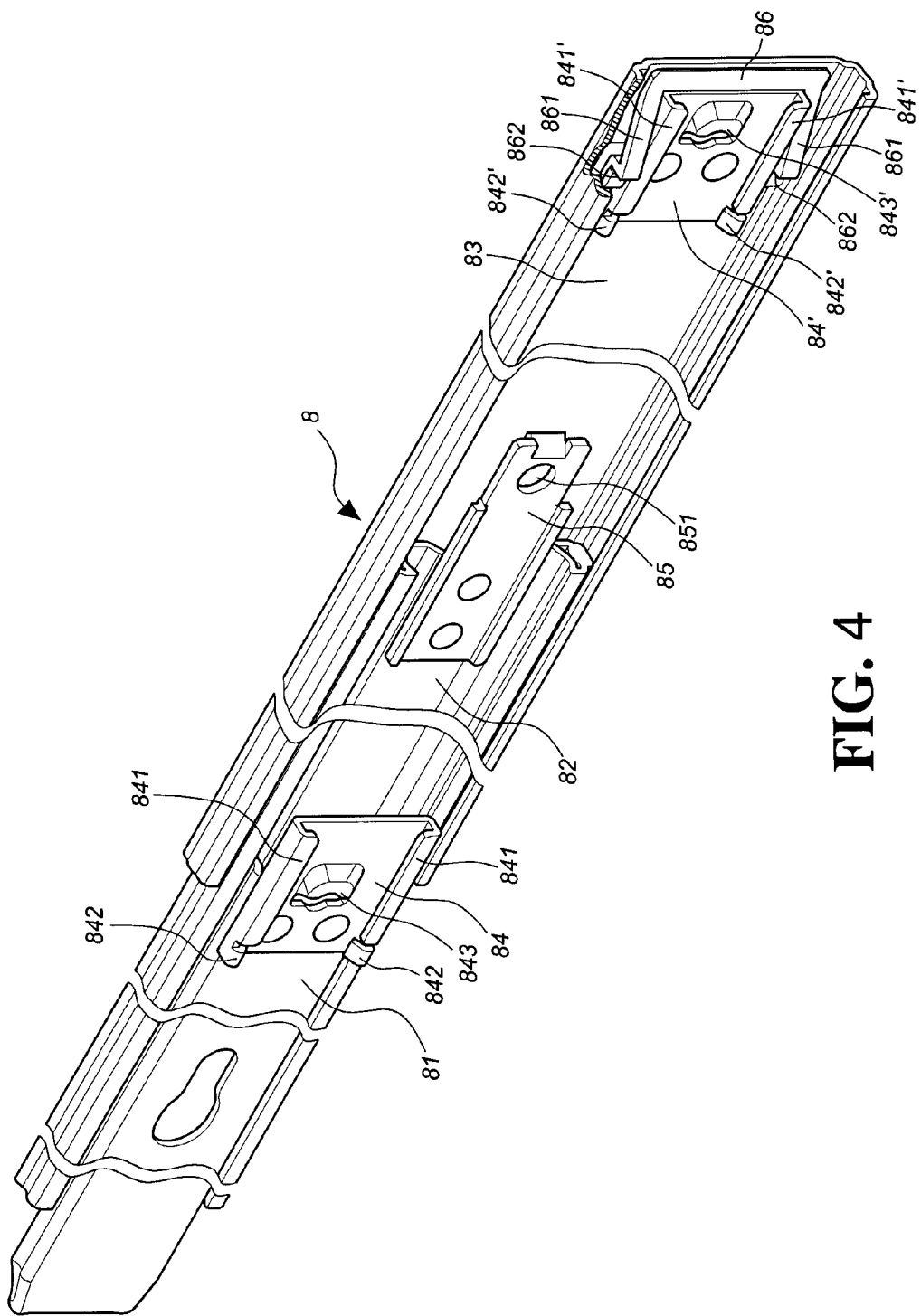
FIG. 4 is a schematic view showing that a construction of a slide assembly of the preferred embodiment of the present invention.

Now referring to FIG. 4, a slide assembly for connection of the cable management arm comprises an inner track (81), a middle track (82), and an outer track (83). The inner track (81) is provided with a wedging base (84) at a rear end thereof. The outer track (83) is provided with a wedging base (84') at a rear end thereof. The middle track (82) is provided with a locating member (85) at a rear end thereof. Folded edges (841) and retaining bits (842) are provided on the top and bottom of the wedging base (84). A retaining piece (843) is provided at the center of the wedging base (84). Folded edges (841') and retaining bits (842') are provided on the top and bottom of the wedging base (84'). A retaining piece (843') is provided at the center of the wedging base (84'). The locating member (85) has a through hole (851). A resilient retainer (86) is provided on the rear end of the outer track (83). The resilient retainer (86) is provided with two retaining feet (861) corresponding to the top and bottom of the wedging base (84') at the rear end of the outer track (83). A retaining surface (862) is disposed on the end of each of the retaining feet (861).

Figure 5:
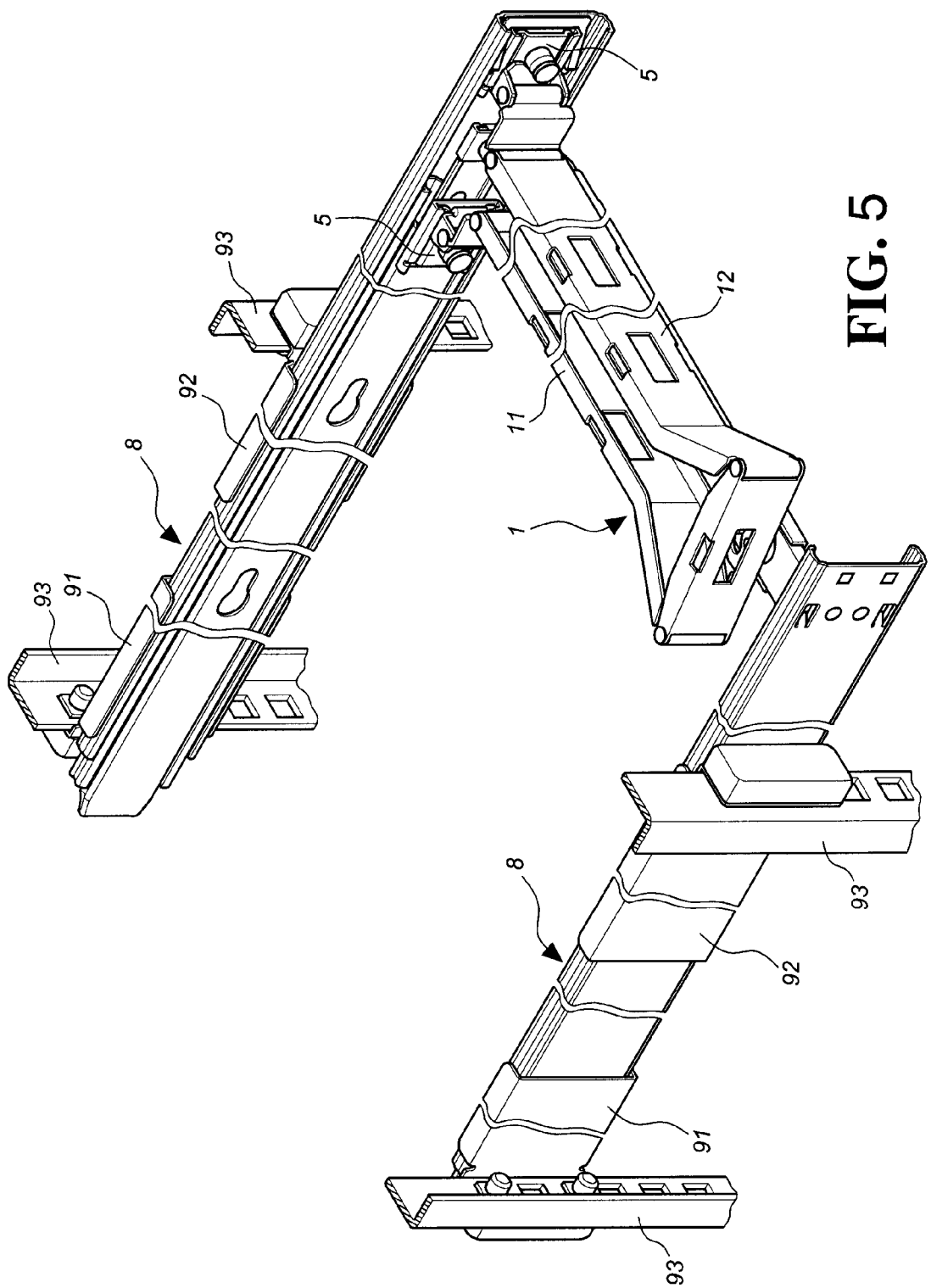
FIG. 5 is a schematic view showing that the preferred embodiment of the present invention is mounted to the slide assembly and then to a support.
Figure 6:
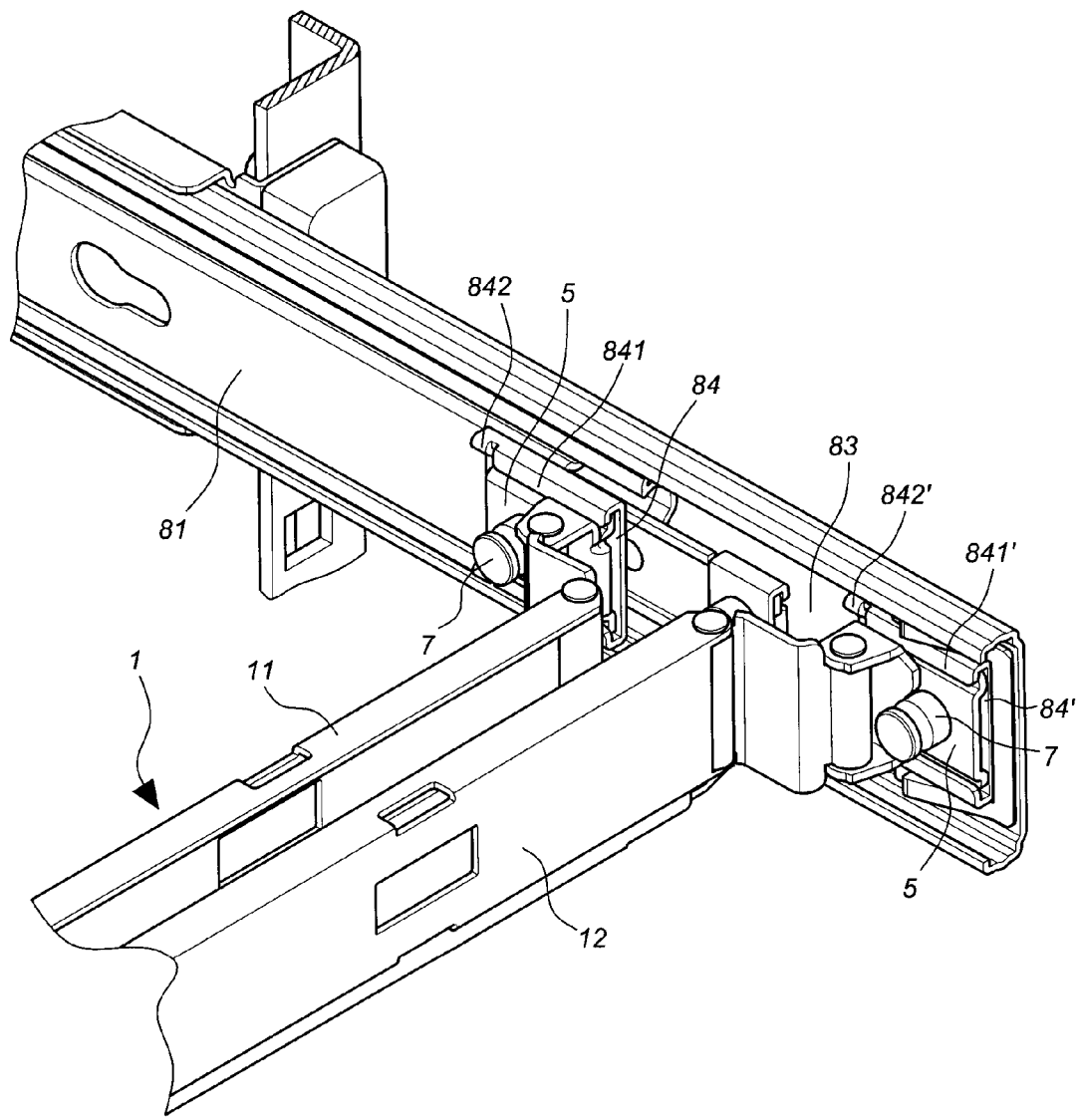
FIG. 6 is a schematic view showing that a main body of the preferred embodiment of the present invention is connected to a wedging base by means of a mounting member.
Figure 7:
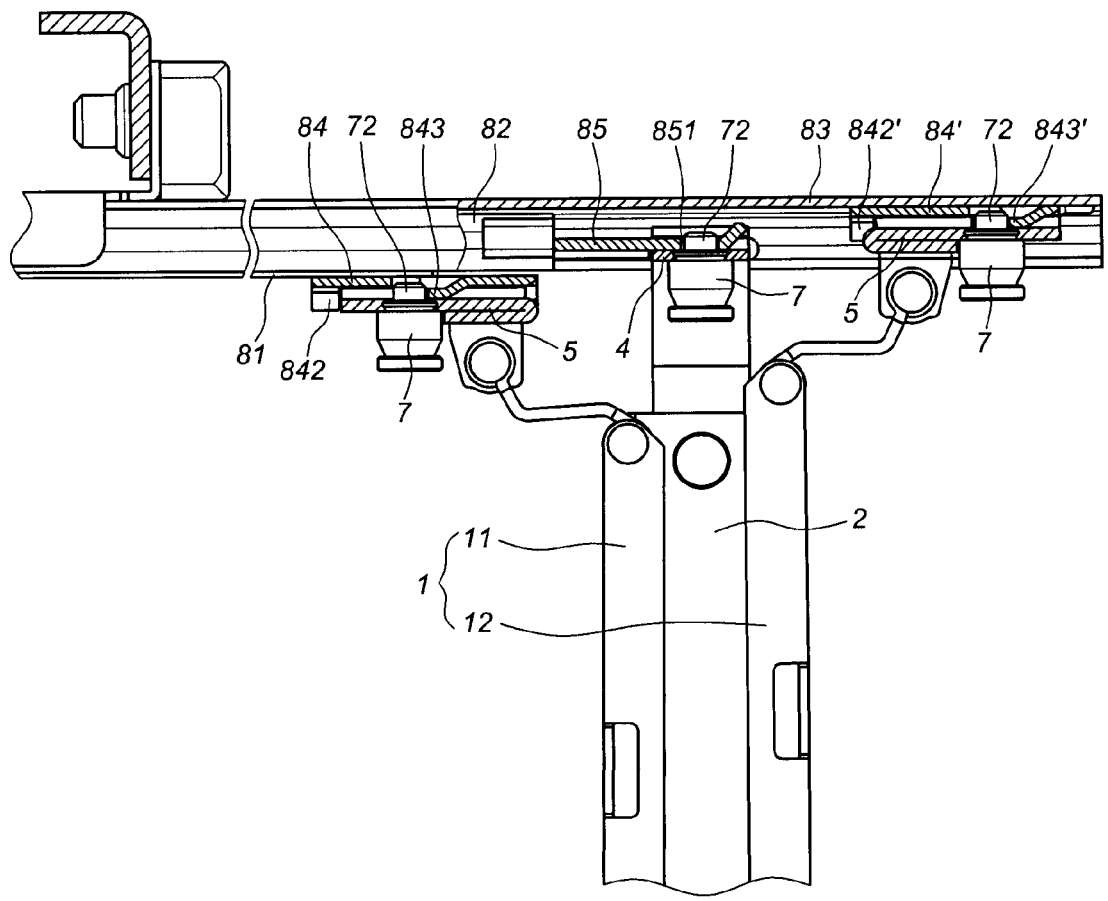
FIG. 7 is a sectional view showing that the mounting member of the preferred embodiment of the present invention is connected to the wedging base and a support locking member is connected by insertion to a locating member.
Figure 8:
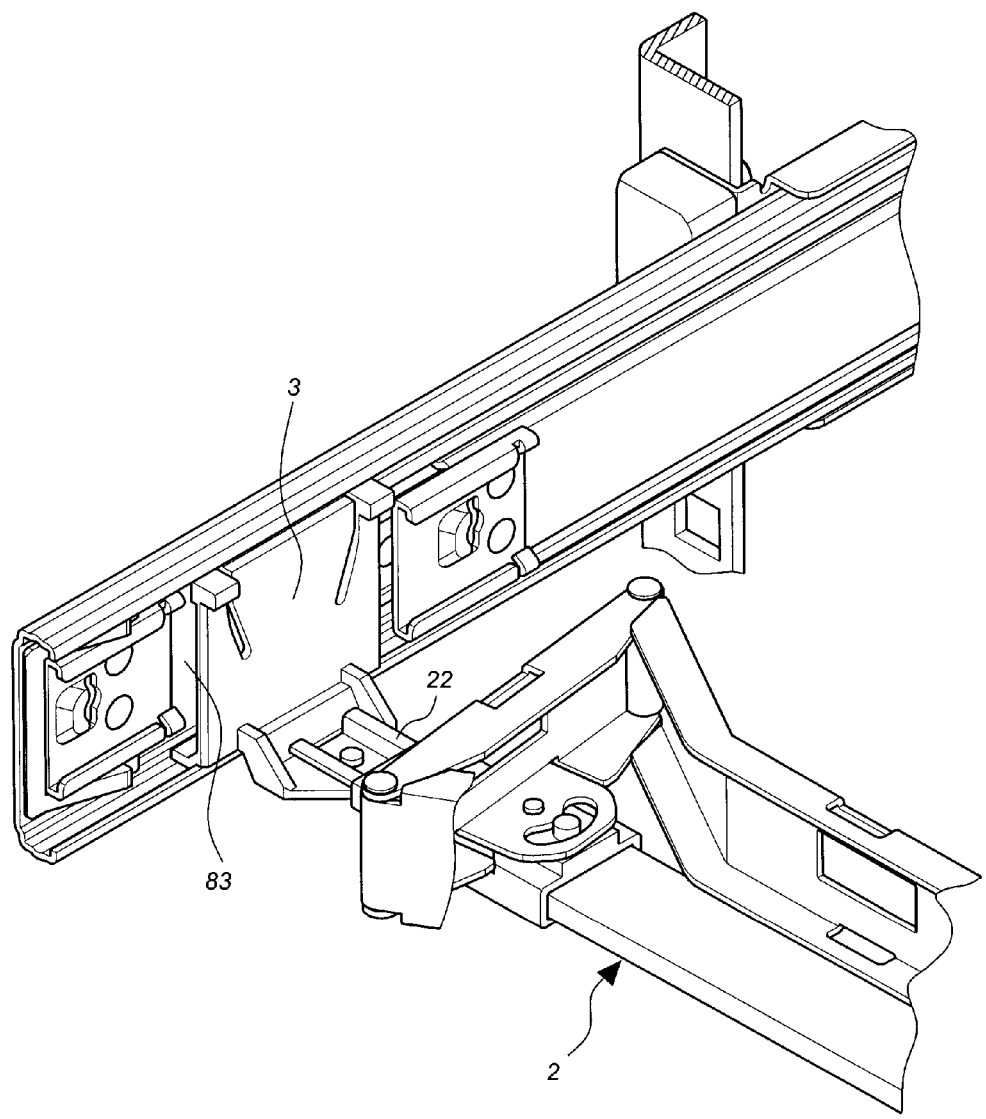
FIG. 8 is a schematic view showing that a support frame of the preferred embodiment of the present invention is connected to an outer track by means of a support block.
Figure 9:
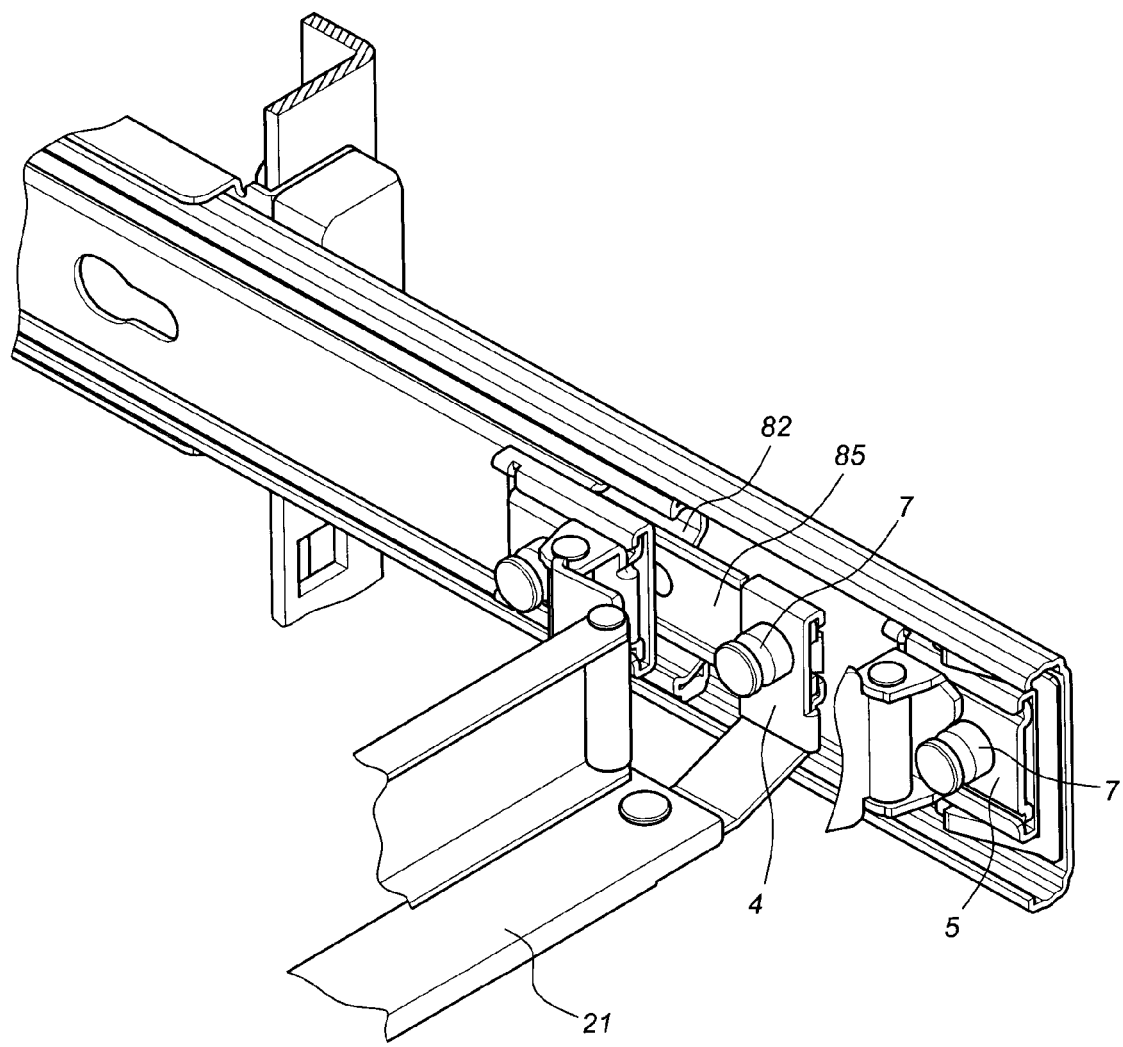
FIG. 9 is a schematic view showing that the support frame is connected by insertion to the locating member disposed at a rear end of a middle track by means of the support locking member.

To assemble the preferred embodiment in practical use as illustrated in FIG. 5, the slide assembly (8) is separately incorporated with a front bracket (91) and a rear bracket (92). The front bracket (91) and the rear bracket (92) are mounted to supports (93), respectively. The two mounting members (5) respectively disposed on both ends of the main body (1) are connected to the slide assembly (8). As illustrated in FIGS. 6 and 7, the front arm (11) of the main body (1) is inserted by means of the mounting member (5) into the folded edges (841) of the wedging base (84) disposed at the rear end of the inner track (81) and holds against the retaining bits (842); meanwhile, the engaging button (7) on the mounting member (5) is inserted into and holds against the retaining piece (843) of the wedging base (84) by means of the bolt (72). Similarly, the rear arm (12) of the main body (1) is inserted by means of the mounting member (5) into the wedging base (84') disposed at the rear end of the outer track (83); the mounting member (5) inserts through the folded edges (841') of the wedging base (84') to hold against the retaining bits (842'); and the engaging button (7) on the mounting member (5) has the bolt (72) to hold against the retaining piece (843') of the wedging base (84') to secure the mounting member (5) in position. As illustrated in FIG. 8, one end of the support frame (2) slides in the outer track (83) by means of the support block (3) connected to the inner rod (22) of the support frame (2); the other end of the support frame (2) is connected by insertion to the locating member (85) disposed at the rear end of the middle track (82) by means of the support locking member (4) connected to the outer rod (21) of the support frame (2) as illustrated in FIG. 9; and the engaging button (7) on the support locking member (4) has the bolt (72) inserted into the through hole (851) of the locating member (85) as illustrated in FIG. 7.

Figure 10:
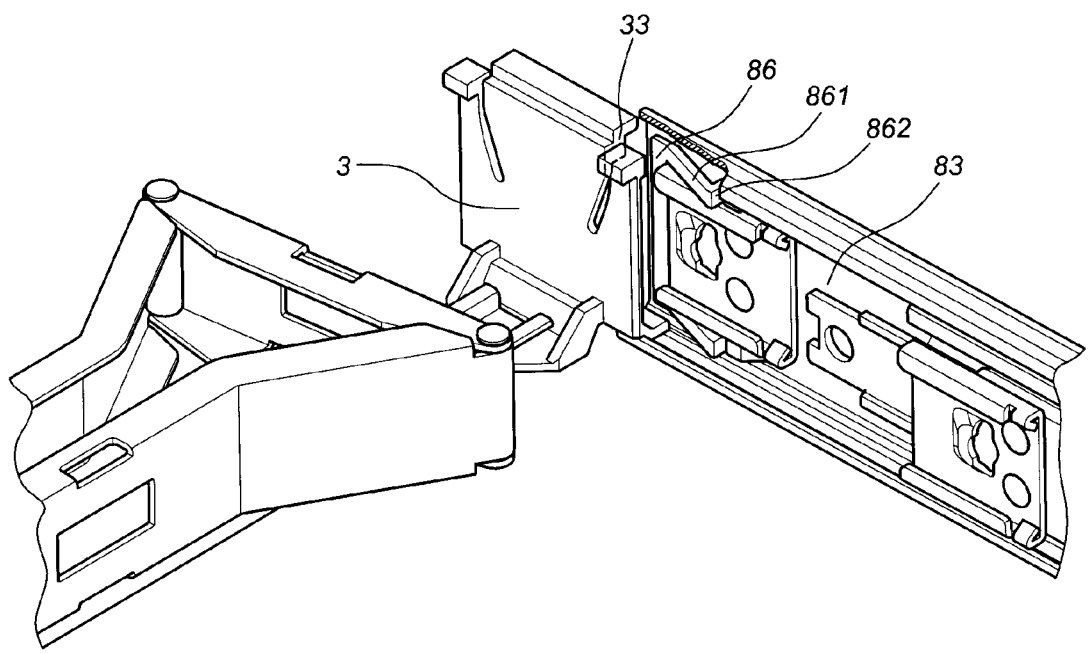
FIG. 10 is a schematic view showing a status of having the support block inserted to the outer track in the preferred embodiment of the present invention.
Figure 11:
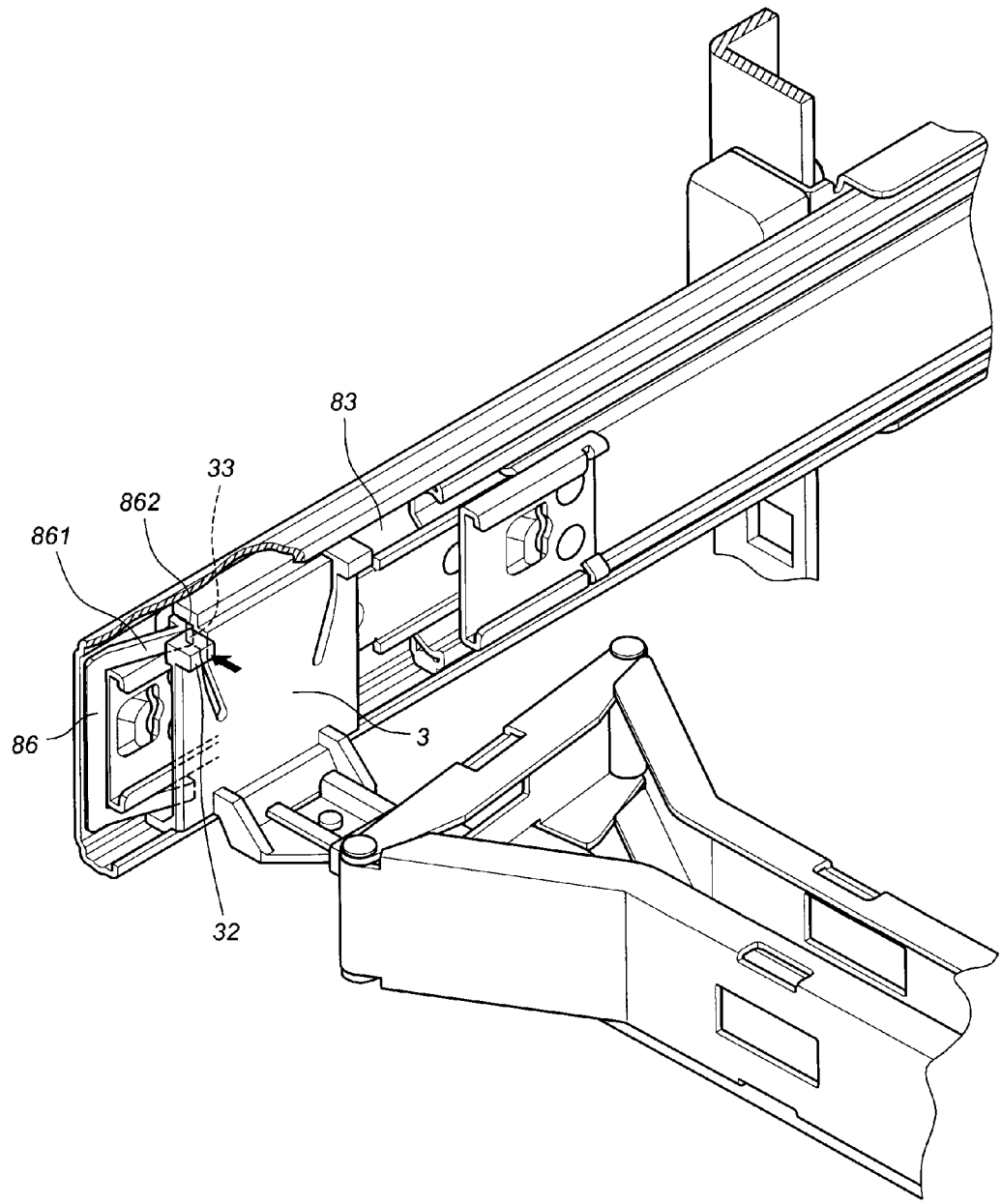
FIG. 11 is a schematic view showing that the support block is removed from the outer track in the preferred embodiment of the present invention.

Upon placing the support block (3) into the outer track (83) as illustrated in FIG. 10, the support block (3) is inserted into the rear end of the outer track (83) so that the protruding bit (33) of the support block (3) compresses against and passes through the retaining feet (861) of the resilient retainer (86). Once the support block (3) passes through the resilient retainer (86) and the support block (3) moves backward, the support block (3) is prevented from falling off the outer track (83) since it will be stopped on the retaining surface (862) of each of the retaining feet (861) by means of the protruding bit (33). To remove the support block (3) as illustrated in FIG. 11, have the support block (3) to retreat to the retaining surface (862) of each retaining foot (861) for both press portions (32) to correspond to both retaining feet (861); meanwhile, by holding down both press portions (32) of the support block (3) for them to hold against both retaining feet (861) thus to release the protruding bit (33) of the support block (3) from both retaining surfaces (862) of the retaining feet (861) for removing the support block (3) out of the rear end of the outer track (83).

Figure 12:
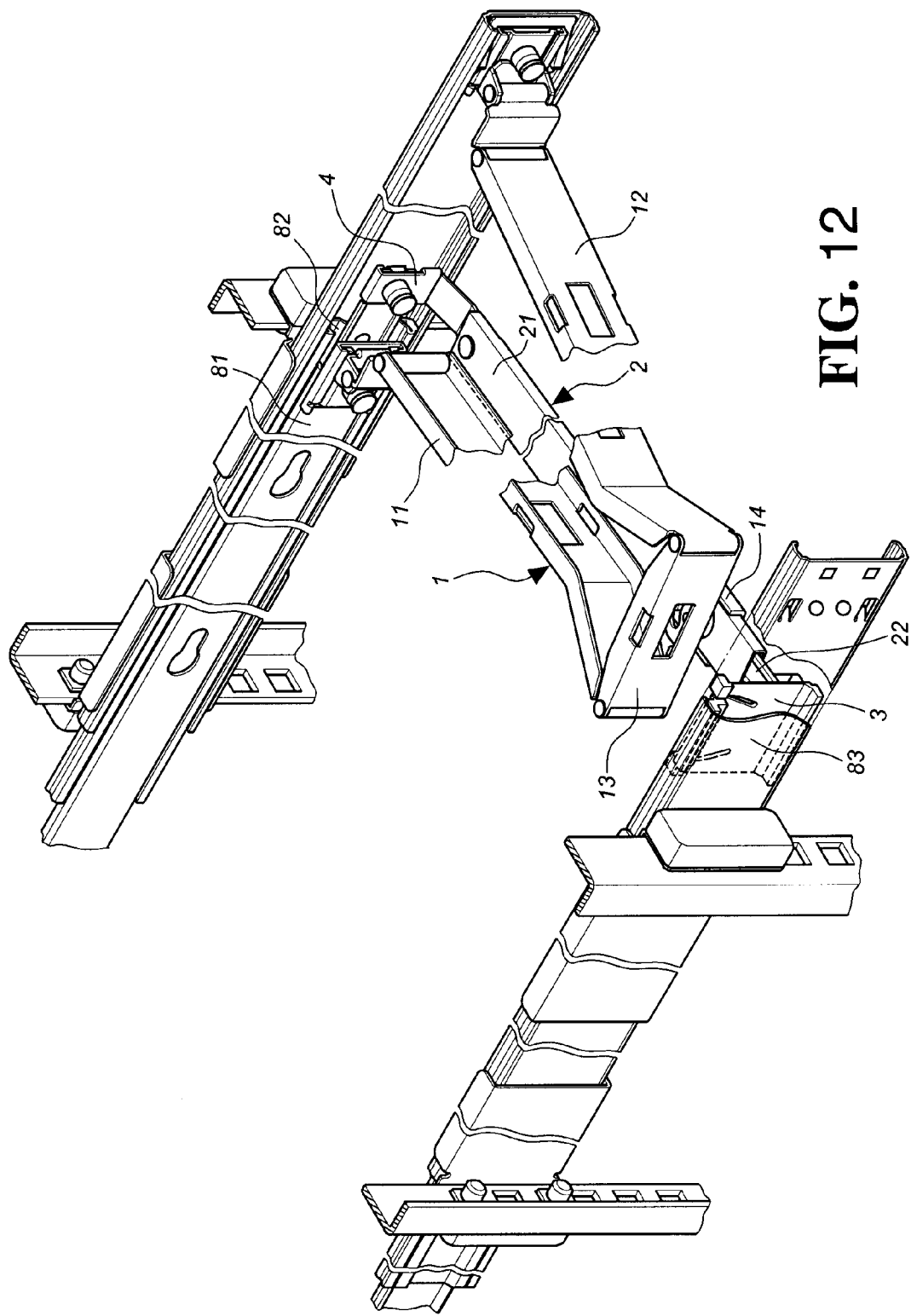
FIG. 12 is a schematic view showing a status that the cable management arm is initially stretched out along with the slide assembly.
Figure 13:
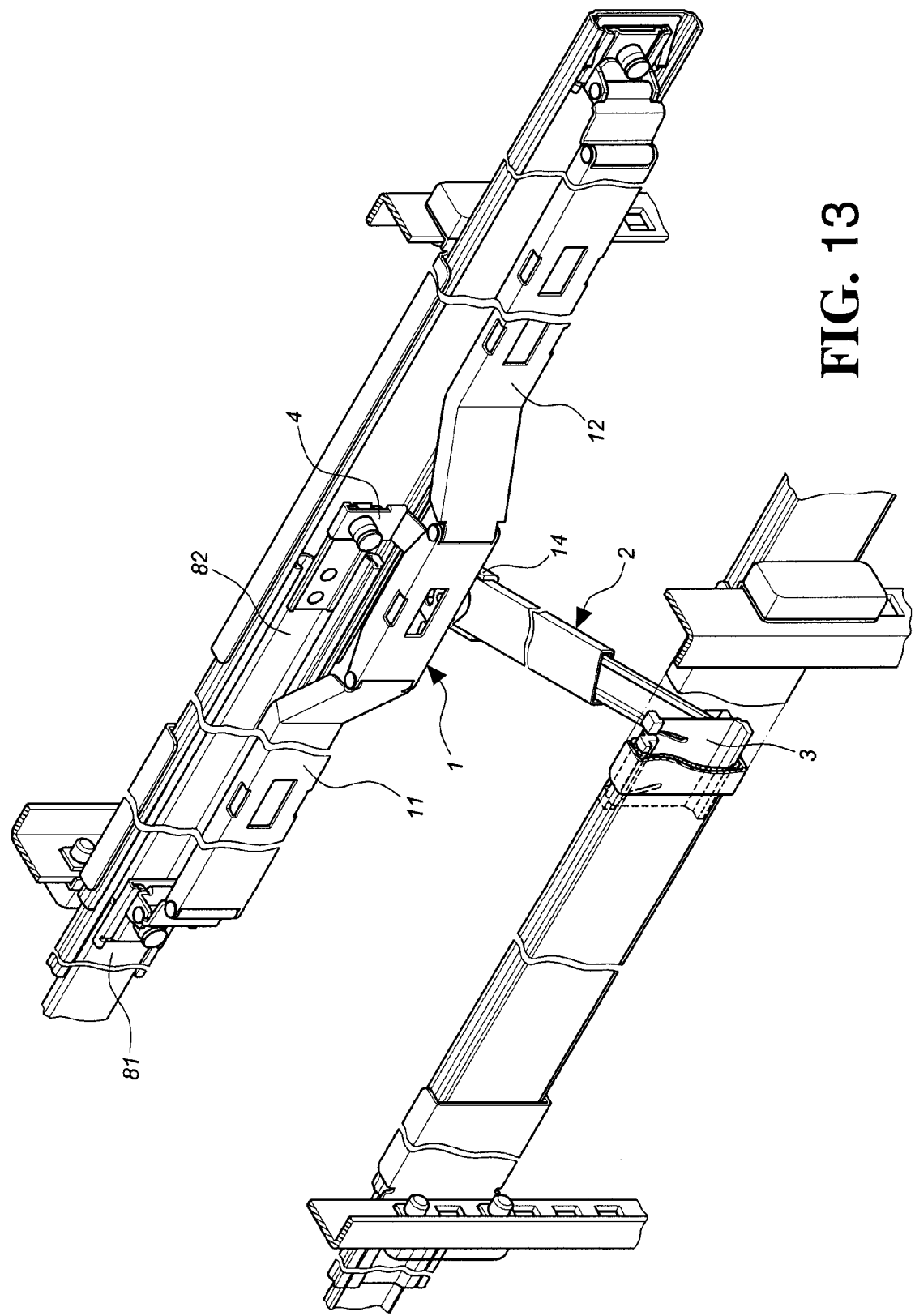
FIG. 13 is a schematic view showing a status that the cable management arm is fully stretched out along with the slide assembly.

According to the preferred embodiment, when the cable management arm operates by following pull and stretch of the slide assembly as illustrated in FIG. 12, the front arm (11) of the main body (1) and the support locking member (4) connected to the outer rod (21) of the support frame (2) will be displaced by following pull and stretch of the inner track (81) and the middle track (82); and the support block (3) connected to the other end of the support frame (4) through the inner rod (22) slides freely on the outer track (83). Meanwhile, both the outer rod (21) and the inner rod (22) of the support frame (2) will be pulled and stretched out and the support frame (2) inclines to a certain angle; the middle arm (13) of the main body (1) slides for a certain distance on the support frame (2) through the sleeve (14); and the sleeve (14) turns for a certain angle in relation to the middle arm (13). Consequently, as illustrated in FIG. 13, when both the inner track (81) and the middle track (82) are completely stretched out at different angle, the front arm (11) and the rear arm (12) of the main body (1) practically indicate a straight line to have the largest space and distance for stretching out. Meanwhile, the sleeve (14) located in the middle of the main body (1) slides from one end of the support frame (2) close to the support block (3) to another end of the support-locking member (4) close to the support locking member (4).

What is claimed is:

1. A cable management arm connection system comprising: a main body, a support frame, a pair of slide assemblies, a support block, a support locking member, and two mounting members; the slide assembly including an inner track, a middle track, and an outer track, the inner track being slidably displaced relative to the middle track and the middle track being slidably displaceable relative to the outer track, rear ends of the inner track and the outer track being respectively provided with a wedging base, folded edges and retaining bits are provided on a top and bottom of each wedging base; a retaining piece being disposed at a center of each wedging base; a locating member being disposed on a rear end of the middle track, the locating member being disposed with a through hole; the main body comprising a front arm, a rear arm, a middle arm, and a sleeve, each of the front and rear arms being coupled to a respective one of the two mounting members, the two mounting members being coupled to the two wedging bases of a first of the pair of slide assemblies, each of the mounting members being provided with a respective one of a pair of first engaging buttons for respective releasable coupling to the wedging bases, the middle arm being pivotally connected on a first end thereof to the front arm and pivotally connected on a second end to the rear arm, the sleeve being pivotally connected to the middle arm intermediate the first and second ends thereof, the middle arm having a slot formed therethrough with an arcuate contour and the sleeve having a retainer extending therefrom into the slot to thereby limit rotational displacement of the sleeve relative to the middle arm; the support frame being slidably received in the sleeve and having two opposing ends respectively connected to the support block and the support locking member, the support block being slidably coupled to a second of the pair of slide assemblies and the support locking member being coupled to the first of the pair of slide assemblies for displacement thereby, the support locking member being provided with a second engaging button for releasable coupling to the locating member; wherein displacement of the pair of slide assemblies in turn displaces the front and middle arms relative to the rear arm and displaces the support locking member relative to the mounting member that is coupled to the rear arm, and displacement of the middle arm and the sleeve therewith in turn slides the support block relative to the second of the pair of slide assemblies to maintain support of the middle arm throughout the displacement thereof.

2. The cable management arm connection system as claimed in claim 1, wherein each of the two mounting members is connected to a transition plate; one mounting member is connected to the front arm by means of the transition plate; and the other mounting member is connected to the rear arm by means of another transition plate.

3. The cable management arm connection system as claimed in claim 1, wherein the support frame comprises an outer rod and an inner rod; the inner rod is connected into the outer rod; the support block is provided with a pivoting plate; one end of the outer rod of the support frame is connected to the support locking member; one end of the inner rod is connected to the pivoting plate of the support block; and the outer rod is slidably received within the sleeve.

4. The cable management arm connection system as claimed in claim 1, wherein two press portions are disposed on the support block; and each of the press portions is resiliently bent.

5. The cable management arm connection system as claimed in claim 1, wherein a protruding bit is disposed on the back of the support block.

6. The cable management arm connection system as claimed in claim 1, wherein each of the first and second engaging buttons comprise a cylinder, a bolt, a pull, and an elastic element; the elastic element is received in the cylinder; the bolt penetrates through the cylinder and the elastic member; the bolt and the pull are connected to each other; the elastic element holds against the cylinder and the bolt; and the pull and the bolt are subject to the elastic element to maintain the bolt being exposed to hold against a corresponding one of the wedging bases and the locating member.

7. The cable management arm connection system as claimed in claim 1, wherein the rear end of the outer track is provided with a resilient retainer; and the resilient retainer is provided with a pair of retaining feet with each foot having a retaining surface.

* * * * *